US006974782B2

(12) United States Patent  (10) Patent No.: US 6,974,782 B2
Foulke  (45) Date of Patent: Dec. 13, 2005

(54) RETICLE TRACKING AND CLEANING

(75) Inventor: Richard F Foulke, deceased, late of Stoneham, MA (US); by Richard F. Foulke, Jr., legal representative, Hampstead, NH (US)

(73) Assignee: R. Foulke Development Company, LLC, Salem, NH (US)

( * ) Notice: Subject to any disclaimer, the term of this patent is extended or adjusted under 35 U.S.C. 154(b) by 0 days.

(21) Appl. No.: 10/635,231

(22) Filed: Aug. 6, 2003

(65) Prior Publication Data

US 2004/0185682 A1  Sep. 23, 2004

Related U.S. Application Data

(60) Provisional application No. 60/402,865, filed on Aug. 9, 2002.

(51) Int. Cl.$^7$ ............................. H01L 21/00; G03F 1/00
(52) U.S. Cl. ........................... 438/800; 430/5; 430/644
(58) Field of Search ..................... 438/800; 324/457; 206/710; 430/4, 5, 644; 414/DIG. 909, DIG. 935; 702/188

(56) References Cited

U.S. PATENT DOCUMENTS 6,216,873 B1 * 4/2001 Fosnight et al. ............ 206/710
6,614,235 B2 * 9/2003 Kraz .......................... 324/457

OTHER PUBLICATIONS

Asyst Fluorotrac MicroTags and Antennas [online] [retrieved on Jan. 16, 2002], retrieved from http://www.asyst.com/prod/sts/sts_FMTA.html.
Brooks-PRI Automation Announces Acquisition of HERMOS Informatik GmbH [online] (press release) [retrieved on Jul. 15, 2002], retrieved from http://biz.yahoo.com/prnews/020708/nem009_1.html.

* cited by examiner

*Primary Examiner*—Evan Pert
(74) *Attorney, Agent, or Firm*—Hamilton, Brook, Smith & Reynolds, P.C.

(57) ABSTRACT

A reticle assembly includes a reticle with a reticle plate. A radio frequency device is positioned on the reticle for providing information regarding the reticle to a reader by radio frequency.

5 Claims, 7 Drawing Sheets

RETICLE TRACKING AND CLEANING

RELATED APPLICATION(S)

This application claims the benefit of U.S. Provisional Application No. 60/402,865, filed Aug. 9, 2002. The entire teachings of the above application(s) are incorporated herein by reference.

BACKGROUND

Tools called reticles are used in the manufacture of semiconductor devices to optically expose circuit images on wafers. Often, twenty or more reticles may be required for processing a semiconductor wafer. Reticles commonly include a 6"×6"×¼" thick or a 9"×9"×½" thick optically clear quartz plate with a chrome image on the bottom side. Reticles also include a pellicle formed of a very thin transparent membrane for keeping particles away from the quartz surface and chrome image. The pellicle is typically mounted to a pellicle frame by adhesive such as glue. The pellicle frame is, in turn, adhered to the reticle plate. The particles will not be seen during the image exposure on the wafer as the particles will be kept out of the focal plane of the chrome image on the reticle plate.

A reticle stocker is usually employed to store large quantities of reticles. The reticles are often stored in an open fashion. This is called open or bare reticle storage and allows the highest density storage of reticles for long term storage. A typical reticle stocker will have a very clean or ultra clean air flow to prevent particles from adhering to the reticles in storage. A reticle stocker may also be designed to store reticle storage pods or shipping containers instead of storing reticles in open fashion. Robotic automation is often used to access the reticles stored inside the reticle stocker. The reticles are placed into reticle pods prior to leaving the stocker and can be placed onto automated transport vehicles for transport throughout the semiconductor facility.

In order to keep track of the reticles, identifying information is provided on the reticles which requires visual or optical reading. This often involves physical handling of the reticle which can generate particles or scratches on the reticle. Particles or scratches on reticles are undesirable in that the optical quality of the reticle can be reduced.

SUMMARY

The present invention provides a reticle assembly which allows reticles to be tracked without physical handling.

The reticle assembly includes a reticle with a reticle plate. A radio frequency device is positioned on the reticle for providing information regarding the reticle to a reader by radio frequency.

In preferred embodiments, the reticle includes a pellicle mounted to the reticle plate by a pellicle frame. The radio frequency device is mounted to the pellicle frame. In such an embodiment, the radio frequency device can be removed from the reticle plate with the pellicle frame when the reticle is cleaned with cleaning solutions. In another embodiment, the radio frequency device is mounted to the reticle plate.

The present invention also provides a container assembly including a container with at least one reticle assembly positioned within the container. The reticle assembly includes a reticle plate and a radio frequency device positioned on the reticle for providing information regarding the reticle to a reader positioned externally to the container by radio frequency.

The present invention additionally provides a semiconductor wafer including a series of circuits formed on the wafer. A radio frequency device circuit is also formed on the wafer and is capable of providing information regarding the wafer to a reader by radio frequency.

In preferred embodiments, the radio frequency device circuit is formed on the wafer by processing steps. The radio frequency device circuit includes an antenna formed on the wafer.

The present invention further provides a reticle stocker including an enclosure for storing reticles. A robot is positioned within the enclosure for moving the reticles within the enclosure. A reticle cleaning station for cleaning the reticles is configured and positioned relative to the enclosure so that reticles within the enclosure requiring cleaning can be moved into the reticle cleaning station by the robot.

The present invention also provides a method of tracking a reticle including positioning a radio frequency device on the reticle. Information regarding the reticle from the radio frequency device is read with a reader by radio frequency.

In preferred embodiments, the reticle is read while enclosed within a container. The reticle includes a reticle plate to which a pellicle is mounted by a pellicle frame. The radio frequency device is mounted to the pellicle frame.

The present invention also provides a method of tracking a semiconductor wafer including forming a series of circuits on the wafer. A radio frequency device circuit is also formed on the wafer and is capable of providing information regarding the wafer to a reader by radio frequency for tracking the wafer.

The present invention further provides a method of cleaning reticles including storing reticles within an enclosure of a reticle stocker. A reticle cleaning station is mounted to the enclosure and is configured and positioned relative to the enclosure so that reticles can be moved from the enclosure to the reticle cleaning station with a robot positioned within the enclosure. The reticles are cleaned within the reticle cleaning station.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
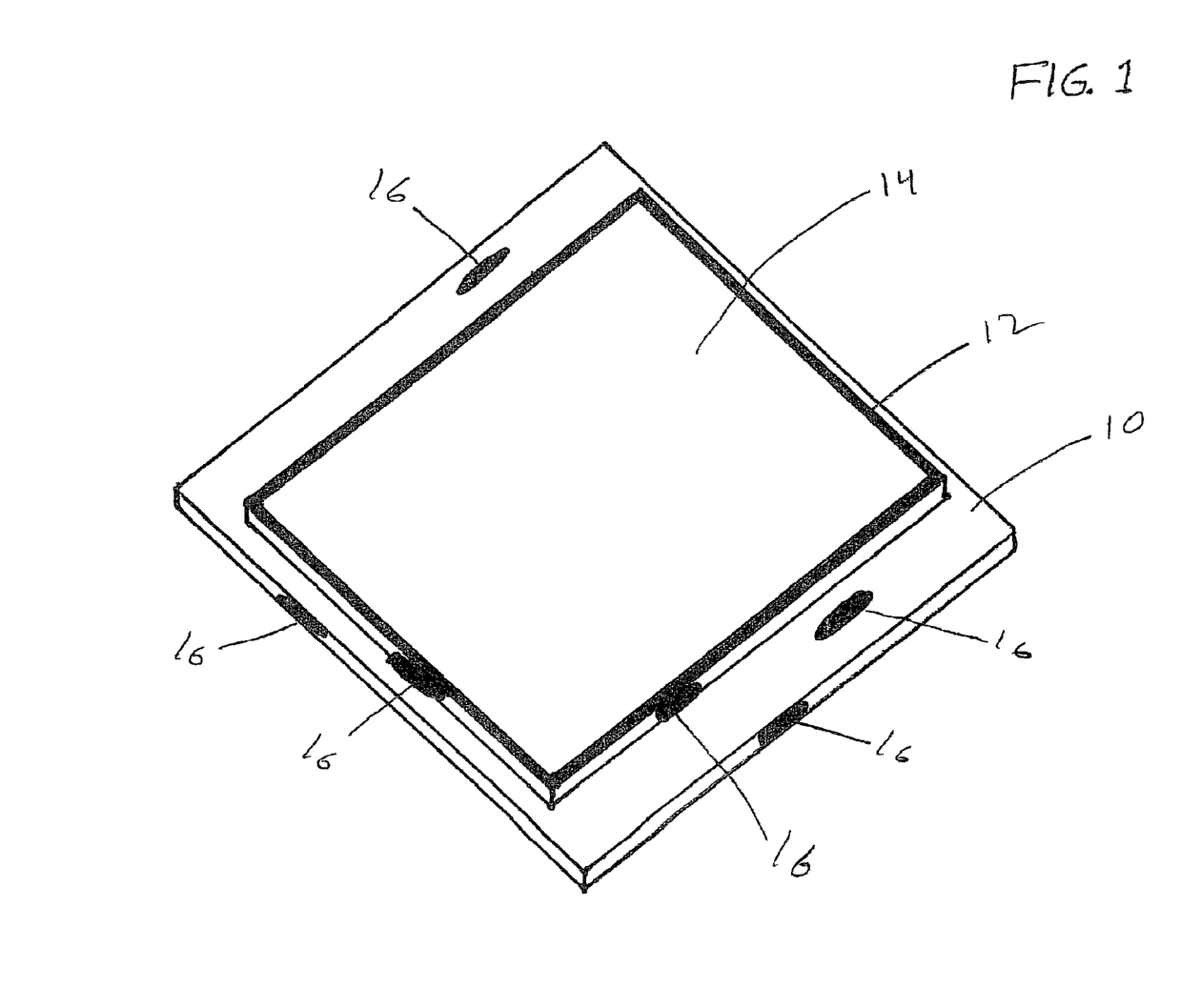
FIG. 1 depicts an isometric view o the bottom of a reticle including a quartz reticle plate, pellicle frame mount and pellicle. Typical locations for mounting a radio frequency identification (RFID) device are shown.

Referring to FIG. 1, reticle 10 has a pellicle frame mount 12 which is commonly manufactured from metal or plastic, and is mounted by adhesive such as glue to the reticle 10. A pellicle 14, being a transparent thin membrane, is fastened to the pellicle frame mount 12 to provide a separation between the pellicle surface and the reticle surface to keep particles away from the chrome image. A radio frequency identification (RFID) device 16 can be mounted to the reticle 10 in different places, for example, as shown. These include mounting the RFID device 16 on the bottom or chrome surface of the reticle 10 outside the pellicle frame 12, on the edge of the reticle 10, or on the pellicle frame 12. Typically, one RFID device 16 is attached to each reticle 10.

The RFID devices 16 can include pills, tapes, and chips with an antenna and contain a nonvolatile memory that is used to store information such as the ID of an item such as a reticle 10. The RFID device 16 is a transponder that contains both a receiver and a transmitter that transmits in response to a specific signal received. The RFID device 16 can be interrogated by a radio frequency reader (not shown) to determine the contents of the information stored in the memory of the RFID device 16. The RFID device 16 can come in many shapes, sizes and frequencies, and is commonly a passive device using RF energy for power, usually without a battery. However, in some situations, a battery may be desired. An RFID pill typically contains the circuitry and antenna inside a glass ampule, commonly ⅛" in diameter by 1" in length. Similar circuitry and antenna can also can also be fastened to a tape substrate and taped to the reticle 10. Alternatively, RFID circuitry and antenna can be on a semiconductor chip that is adhered or attached to the reticle 10.

One advantage of using an RFID device 16 mounted to the reticle 10 is that no handling of the reticle 10 is required to determine the identification of the reticle 10. In the prior art, reticles have an ID number in alphanumeric form or bar code form, on the chrome surface of the reticle. The ID is read visually or optically. This normally requires physically handling the reticle which can generate particles or scratches on the reticle. In the present invention, since no physical handling is required when using an RFID, the introduction of particles or scratches by reading the reticle 10 is prevented. A second advantage is that the reticle 10 does not have to be removed from any containers, such as pods, boxes or enclosures conveying or storing the reticles 10, to identify them. Therefore, the container does not need to be opened, which would also expose the reticle 10 to particles.

An RFID device 16 can be attached to the pellicle frame 12 using the same material used for attaching the pellicle frame 12 to the reticle plate. The pellicle frame 12 is removed during special chemical cleaning of a reticle 10. If the RFID device 16 is attached to the pellicle frame 12, then when the frame 12 is removed for chemical cleaning, the RFID device 16 is also removed. This eliminates the need for special attachment of the RFID device 16 to withstand the chemical cleaning of the reticle 10. After cleaning, a new pellicle 14, pellicle frame 12 and RFID device 16 can be attached to the reticle plate.

Figure 2:
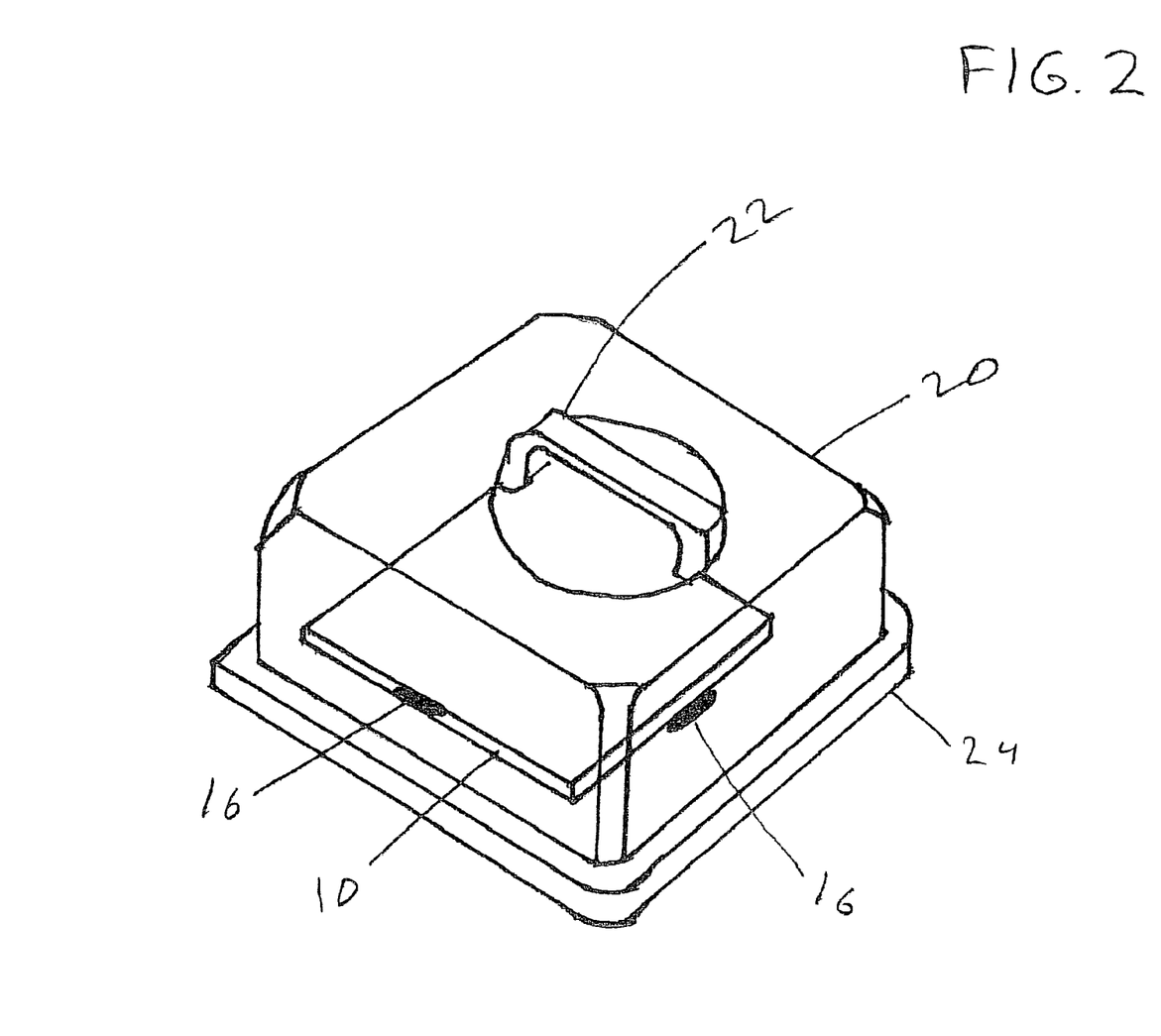
FIG. 2 depicts a single reticle pod containing a single reticle inside.

Referring to FIG. 2, a reticle 10 is securely held inside a reticle pod 20 in a clean environment. Reticle 10 is shown with two possible locations for RFID device 16. The person-friendly handle 22 can be replaced by automation-friendly handles. The top of reticle pod 20 is held to the reticle pod base 24 with securing latches. The RFID device 16 can be interrogated by a reading device from outside the reticle pod 20 without opening the reticle pod 20 using radio frequency. The reticle pod 20 allows transport of reticles 10 therein to the desired locations in the semiconductor facility.

Figure 3:
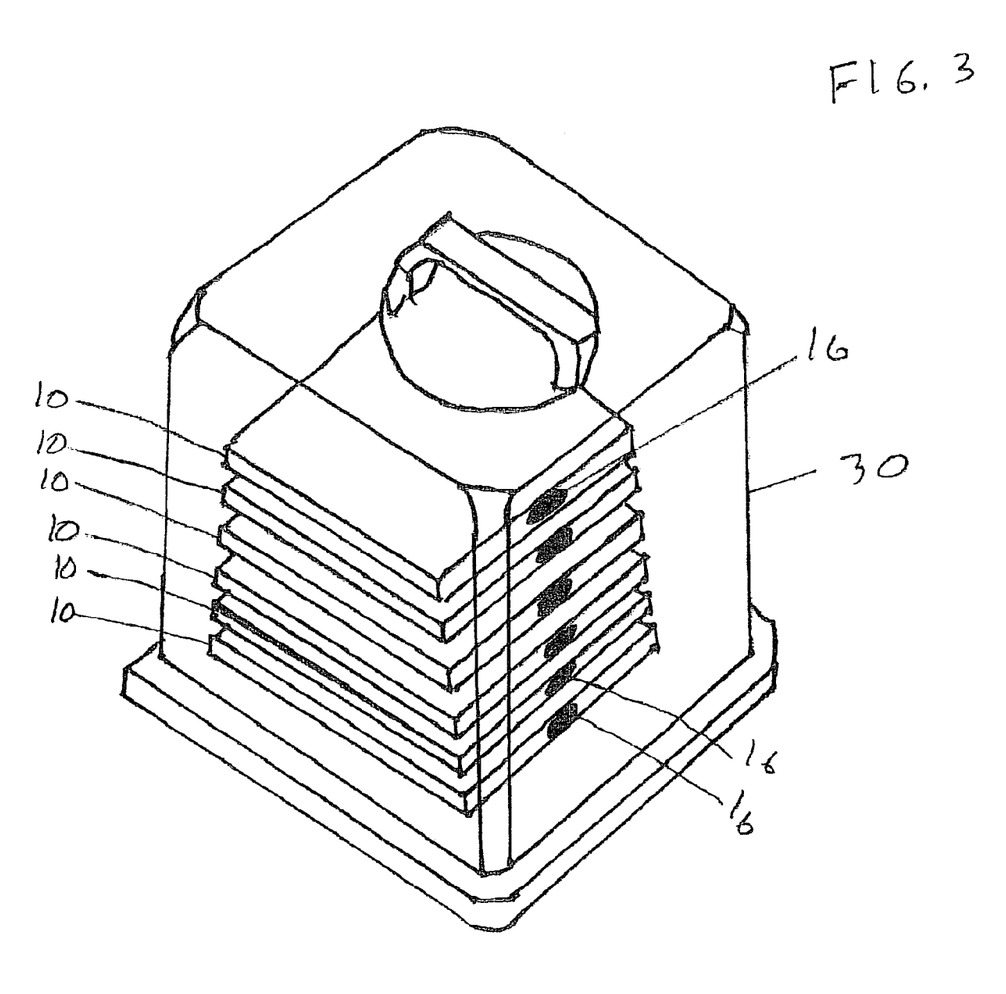
FIG. 3 depicts a multiple reticle pod containing multiple reticles inside.

Referring to FIG. 3, multiple reticles 10 are securely held inside a multiple reticle pod 30. The individual reticles 10 each have an RFID device 16 attached to the reticle 10. Each RFID device 16 can be interrogated to obtain the data stored on the RFID device 16. Again, the reticle identification can be obtained without opening the reticle pod 30 and exposing the reticles 10 to potential contamination by particles.

Figure 4:
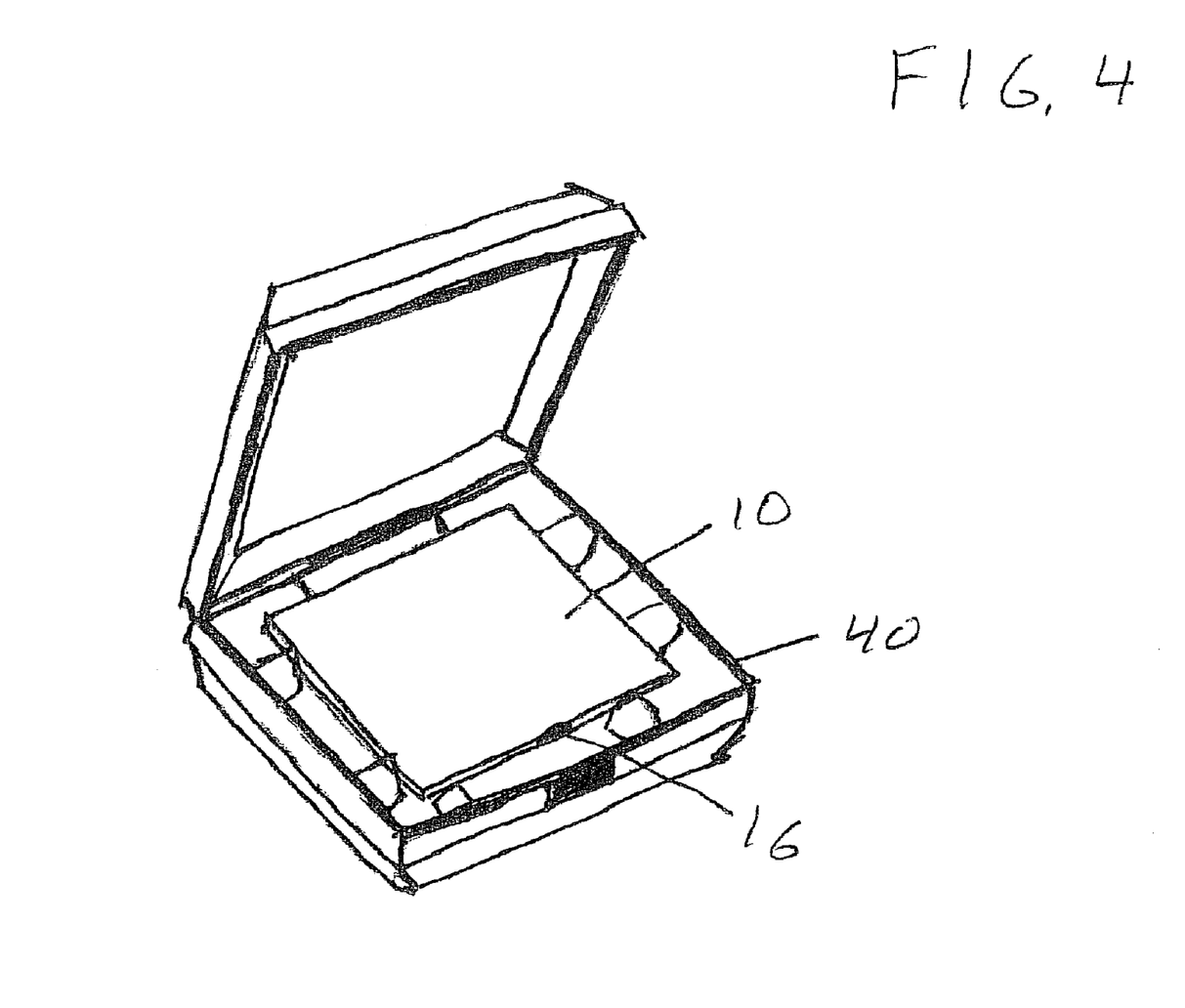
FIG. 4 depicts a reticle shipping container with a single reticle inside.

Referring to FIG. 4, a shipping container 40 holds a single reticle 10. The shipping container typically opens in a clam shell fashion to allow access to the reticle 10 inside. An RFID device 16 is attached to the reticle 10. The reticle identification can be obtained without opening the reticle shipping container 40 and exposing the reticle 10 to potential contamination by particles.

Figure 5:
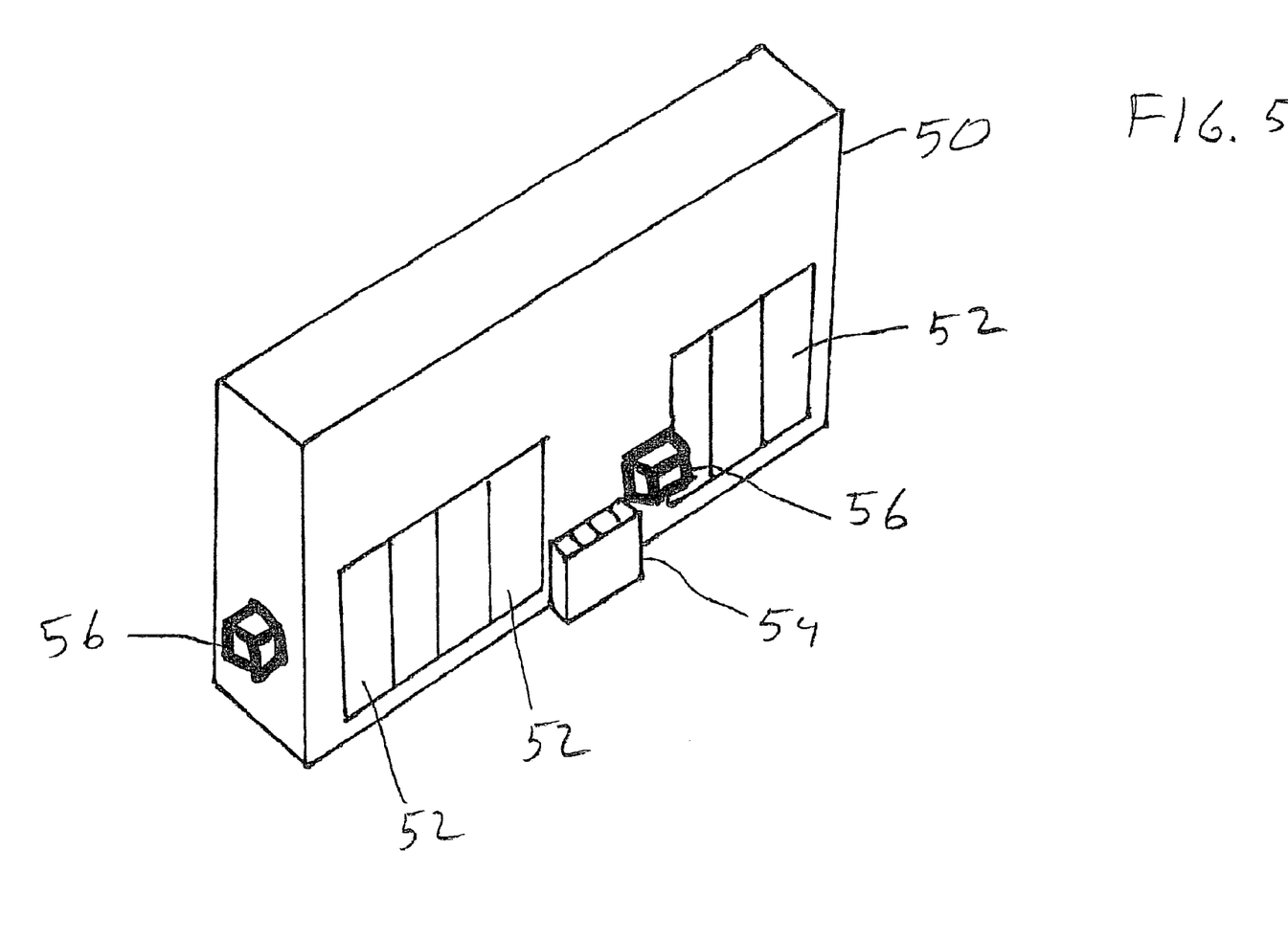
FIG. 5 depicts an embodiment of a reticle stocker with a reticle cleaner device mounted to the stocker.

Referring to FIG. 5, an embodiment of a reticle stocker 50 is shown with access doors 52, and reticle POD input/output loading station 54. The reticles 10 are stored inside the stocker 50 on shelves. The reticle stocker 50 typically has positive air pressure therein to prevent the entrance of particles. A reticle cleaner 56 is shown attached to the reticle stocker 50 with the interiors being in communication with each other. One or more reticle cleaners 56 may be attached to a reticle stocker 50 as shown, the number required dependent on the number of reticles 10 to be cleaned per hour and the rate at which each reticle cleaner 56 is able to clean a reticle 10.

Figure 6A:
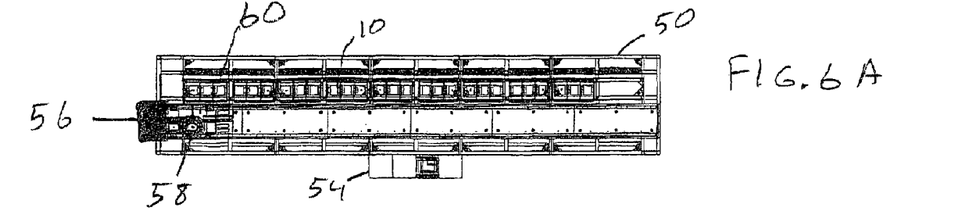
FIGS. 6A–6E depict locations for mounting a reticle cleaner within or attached to a reticle stocker.
Figure 6B:
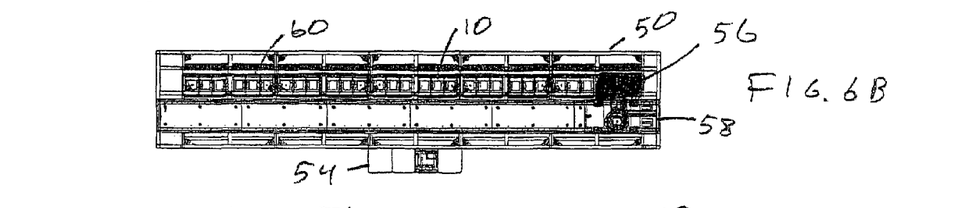
Figure 6C:
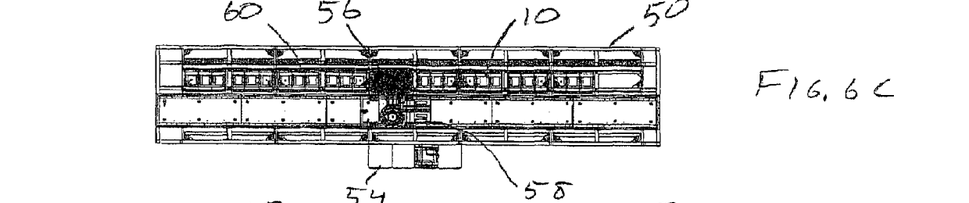
Figure 6D:
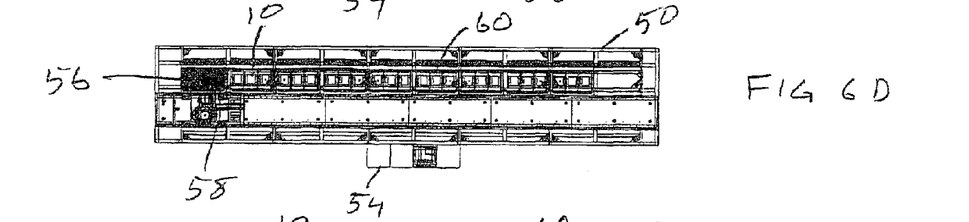
Figure 6E:
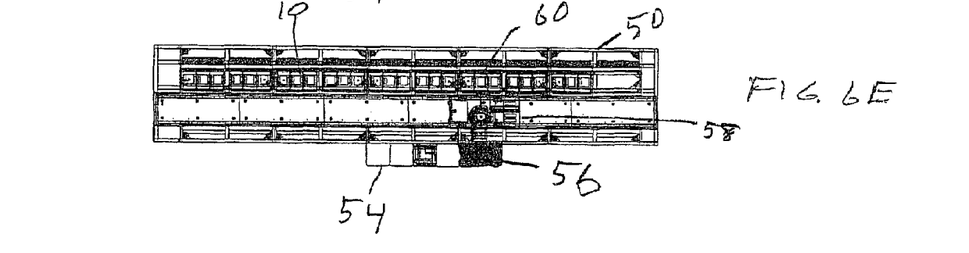

FIGS. 6A–6E show several schematic representations of examples for attachment or positioning of a reticle cleaner 56 relative to a reticle stocker 50. The reticle cleaner 56 can be positioned or attached to the outside of the stocker as in FIG. 6A and FIG. 6E. Alternatively, the reticle cleaner 56 can be placed or positioned inside the reticle stocker 50, as seen in FIGS. 6B, 6C and 6D. A robotic mechanism 58 is used to move a reticle 10 from a shelf 60 to the reticle cleaner 56 or reticle input/output loading station 54. The reticle cleaner 56 is used to remove particles and contamination from reticles 10. Reticle cleaner 56 typically uses a clean stream of gas, such as air, nitrogen, or carbon dioxide, to remove any particles from the reticle 10. Prior art reticle cleaners are typically freestanding systems spaced away from a stocker requiring reticles to be transported from the stocker externally to the cleaner to be cleaned. In the present invention, the reticle cleaner 56 is attached or positioned relative to the reticle stocker 50 so that the reticles 10 do not need to be placed into a reticle pod for transport to the cleaner 56 and then later transported to the process tool requiring the reticle 10 for semiconductor processing. The gripper of the robotic mechanism 58 can place the reticle 10 inside the cleaner 56 for cleaning and then remove the reticle 10 from the cleaner 56 and place the reticle 10 into a pod for removal from the system. The reticle 10 can be deposited into the cleaner 56 and the gripper removed while reticle 10 is in the process of being cleaned so that other reticles can be retrieved or stored during the cleaning. Alternatively, the gripper can remain in the cleaner 56 while the reticle 10 is being cleaned.

Figure 7:
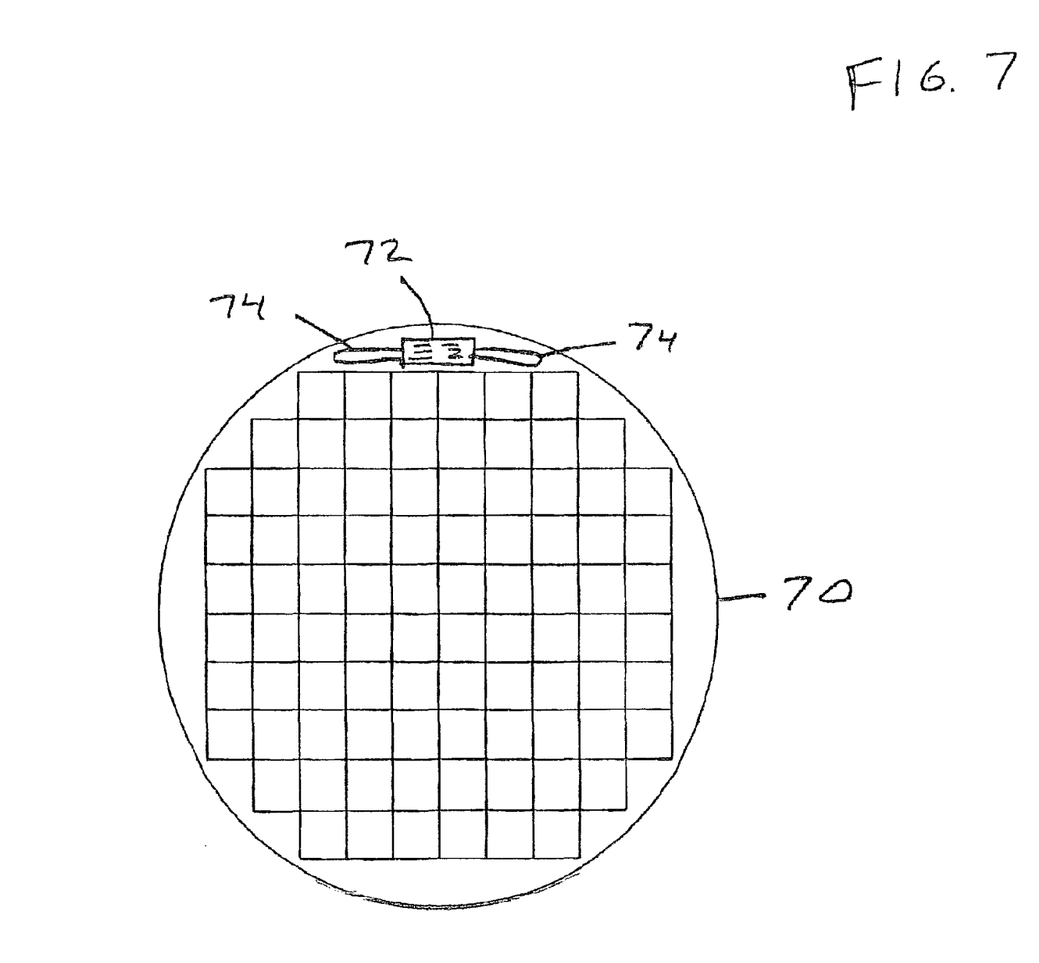
FIG. 7 depicts a semiconductor wafer with an RFID circuit and antenna embedded in the wafer.

FIG. 7 depicts a semiconductor wafer 70 with an RFID circuit 72 etched into the pattern on the wafer in addition to the other circuits being formed thereon. An antenna 74 is also etched into the wafer during the wafer processing steps. The presence of the RFID circuit 72 etched into the wafer means no foreign devices need to be attached to the wafer. The wafer information can be interrogated by a reader by radio frequency without physically handling the wafer to track the progress of the wafer during manufacturing. Although the RFID circuit 72 is shown at the top of wafer 70, it is understood that RFID circuit 72 can be in other suitable locations on wafer 70. In addition, more than one RFID circuit 72 can be positioned on wafer 70 such as test patterns often are. Furthermore, the antenna 74 can be formed from the dividing lines of the wafer 70 to save valuable space. Wafer 70 can be any size, for example, diameters of 150 mm, 200 mm, 300 mm, 450 mm, etc.

While this invention has been particularly shown and described with references to preferred embodiments thereof, it will be understood by those skilled in the art that various changes in form and details may be made therein without departing from the scope of the invention encompassed by the appended claims.

For example, various features of the different embodiments shown and described can be omitted or combined. In addition, it is understood that the reticles 10 shown in FIGS. 2–4 can have the RFID device 16 in any of the locations depicted in FIG. 1 or whatever is best suited.

What is claimed is:

1. A reticle assembly comprising:
   a reticle including a reticle plate;
   a pellicle mounted to the reticle plate by a pellicle frame; and
   a radio frequency device mounted to the pellicle frame for providing information regarding the reticle to a reader by radio frequency.

2. The reticle assembly of claim 1 in which the radio frequency device can be removed with the pellicle frame when the reticle is cleaned.

3. A container assembly comprising:
   a container; and
   at least one reticle assembly positioned within the container, the reticle assembly including a reticle plate, a pellicle mounted to the reticle plate by a pellicle frame, and a radio frequency device mounted to the pellicle frame for providing information regarding the reticle to a reader positioned externally to the container by radio frequency.

4. A method of tracking a reticle, the reticle having a reticle plate, the method comprising:
   mounting a pellicle to the reticle plate by a pellicle frame;
   mounting a radio frequency device to the pellicle frame; and
   reading information regarding the reticle from the radio frequency device with a reader by radio frequency.

5. The method of claim 4 further comprising reading the reticle while the reticle is enclosed within a container.

* * * * *